(12) United States Patent
Doo et al.

(10) Patent No.: US 10,726,882 B2
(45) Date of Patent: *Jul. 28, 2020

(54) POWER MANAGEMENT OF A MEMORY DEVICE BY DYNAMICALLY CHANGING SUPPLY VOLTAGE

(71) Applicant: Samsung Electronics Co., Ltd., Suwon-si, Gyeonggi-do (KR)

(72) Inventors: Su Yeon Doo, Seoul (KR); Taeyoung Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/275,396

(22) Filed: Feb. 14, 2019

(65) Prior Publication Data
US 2019/0180795 A1   Jun. 13, 2019

Related U.S. Application Data

(63) Continuation of application No. 15/416,140, filed on Jan. 26, 2017, now Pat. No. 10,242,719.

(30) Foreign Application Priority Data

Apr. 8, 2016   (KR) .................. 10-2016-0043581
Jun. 24, 2016  (KR) .................. 10-2016-0079521

(51) Int. Cl.
*G06F 1/00* (2006.01)
*G11C 5/14* (2006.01)
*G06F 1/3225* (2019.01)
*G06F 1/3234* (2019.01)
*G06F 1/324* (2019.01)
*G06F 1/26* (2006.01)

(Continued)

(52) U.S. Cl.
CPC .............. *G11C 5/148* (2013.01); *G06F 1/266* (2013.01); *G06F 1/324* (2013.01); *G06F 1/3225* (2013.01); *G06F 1/3275* (2013.01); *G06F 1/3287* (2013.01); *G06F 1/3296* (2013.01)

(58) Field of Classification Search
None
See application file for complete search history.

(56) References Cited

U.S. PATENT DOCUMENTS 6,922,369 B2   7/2005  Kim
7,519,840 B2   4/2009  Choong-Bin; et al.
(Continued)

OTHER PUBLICATIONS

"Power Management of a Memory Device by Dynamically Changing Supply Voltage" Specification, Drawings and Prosecution History of U.S. Appl. No. 15/416,140, filed Jan. 26, 2017, by Su Yeon Doo, et al., which is stored in the United States Patent and Trademark Office (USPTO) Image rile Wrapper (IFW) system.

*Primary Examiner* — Nitin C Patel
(74) *Attorney, Agent, or Firm* — Onello & Mello, LLP

(57) ABSTRACT

An electronic device includes a memory device including a power switch configured to provide one of a first voltage and a second voltage to an internal circuit in response to a control command. A power management device is configured to generate the first voltage, the second voltage, and the control command and to provide the first voltage, the second voltage, and the control command to the memory device. The power switch provides the second voltage to the internal circuit while a level of the first voltage is changed and provides the first voltage to the internal circuit after a level change of the first voltage is completed.

20 Claims, 11 Drawing Sheets

(51) Int. Cl.
   *G06F 1/3287*   (2019.01)
   *G06F 1/3296*   (2019.01)

(56) References Cited

U.S. PATENT DOCUMENTS

| | | |
|---|---|---|
| 7,593,280 B2 | 9/2009 | Kim |
| 8,321,697 B2 | 11/2012 | Fujimoto |
| 8,433,943 B2 | 4/2013 | Lin et al. |
| 8,448,001 B1 | 5/2013 | Zhu et al. |
| 8,674,742 B2 | 3/2014 | Ohashi et al. |
| 8,811,095 B2 | 8/2014 | Tsem et al. |
| 8,996,892 B1 | 3/2015 | Chu et al. |
| 9,007,864 B2 | 4/2015 | Honda |
| 9,032,235 B2 | 5/2015 | Hida et al. |
| 9,176,553 B2 | 11/2015 | Kajigaya et al. |
| 9,239,600 B2 | 1/2016 | Pickholz et al. |
| 9,779,024 B2 | 10/2017 | Ikegami et al. |
| 2004/0125680 A1 | 7/2004 | Kim |
| 2006/0190748 A1 | 8/2006 | Lim et al. |
| 2008/0002485 A1 | 1/2008 | Kim |
| 2011/0022789 A1 | 1/2011 | Fujimoto |
| 2011/0231690 A1 | 9/2011 | Honda |
| 2013/0038372 A1 | 2/2013 | Ohashi et al. |
| 2014/0040650 A1 | 2/2014 | Hida et al. |
| 2015/0277530 A1 | 10/2015 | Rathnakar et al. |
| 2015/0355662 A1 | 12/2015 | Myers et al. |
| 2016/0247567 A1 | 8/2016 | Ikegami et al. |
| 2017/0102754 A1 | 4/2017 | Chi et al. |

POWER MANAGEMENT OF A MEMORY DEVICE BY DYNAMICALLY CHANGING SUPPLY VOLTAGE

CROSS-REFERENCE TO RELATED APPLICATIONS

This application is a continuation application of U.S. patent application Ser. No. 15/416,140, filed on Jan. 26, 2017, now U.S. Pat. No. 10,242,719, issued on Mar. 26, 2019, which claims priority under 35 U.S.C. § 119 from Korean Patent Application No. 10-2016-0043581, filed on Apr. 8, 2016, and from Korean Patent Application No. 10-2016-0079521, filed on Jun. 24, 2016, the disclosures of which are hereby incorporated by reference in their entirety.

BACKGROUND

Embodiments of the inventive concepts described herein relate to dynamic power management, and more particularly, to power management of a memory device by dynamically changing a supply voltage.

Electronic mobile devices typically include semiconductor integrated circuits that are increasingly required to have high integration, high performance, and low power consumption. Low power consumption of a semiconductor integrated circuit may be implemented in various ways, typically by lowering a drive voltage of the semiconductor integrated circuit.

Another method for lowering power consumption of the electronic device is through the use of dynamic voltage frequency scaling (DVFS) technology. The DVFS is a technology to reduce power consumption by changing an operating speed and a drive voltage of a semiconductor integrated circuit according to a workload of an integrated circuit. The semiconductor integrated circuit can change drive voltages of a logic circuit and an interface circuit by the DVFS operation.

When a drive voltage is changed by the DVFS operation, an operating characteristic of the logic circuit and the interface circuit can change. Additionally, the drive voltage may remain unstable for at least a micro unit (e.g. microsecond) when the drive voltage is changed.

SUMMARY

In one aspect, the present inventive concepts are directed to an electronic device comprising a memory device including a power switch configured to provide one of a first voltage and a second voltage to an internal circuit in response to a control command. A power management device is configured to generate the first voltage, the second voltage, and the control command and to provide the first voltage, the second voltage, and the control command to the memory device. The power switch provides the second voltage to the internal circuit while a level of the first voltage is changed and provides the first voltage to the internal circuit after a level change of the first voltage is completed.

In another aspect, the present inventive concepts are directed to a method of changing a supply voltage of an electronic device comprising providing a first voltage to an internal circuit of a memory device included in the electronic device. Changing a level of a second voltage by a power management device included in the electronic device, the power management device generating the first voltage and the second voltage, and the memory device receiving the first voltage and the second voltage. Switching a voltage provided to the internal circuit from the first voltage to the second voltage in response to ta control command of the power management device after a level change of the second voltage is completed.

In another aspect, the present inventive concepts are directed to a method for changing an internal voltage of a memory device comprising generating a first voltage and a second voltage by a power management device included in a host. A command received from the host is stored in a mode register included in the memory device. An internal voltage is supplied to an internal circuit in the memory device in response to the command in the mode register, the internal voltage being one of the first voltage and the second voltage supplied by a power switch included in the memory device. One of the first voltage and the second voltage is changed by powering down the internal circuit for a first duration and supplying the internal voltage with another one of the first voltage and the second voltage for a second duration beginning after the first duration to allow the first voltage to stabilize.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION OF THE EMBODIMENTS

Figure 1:
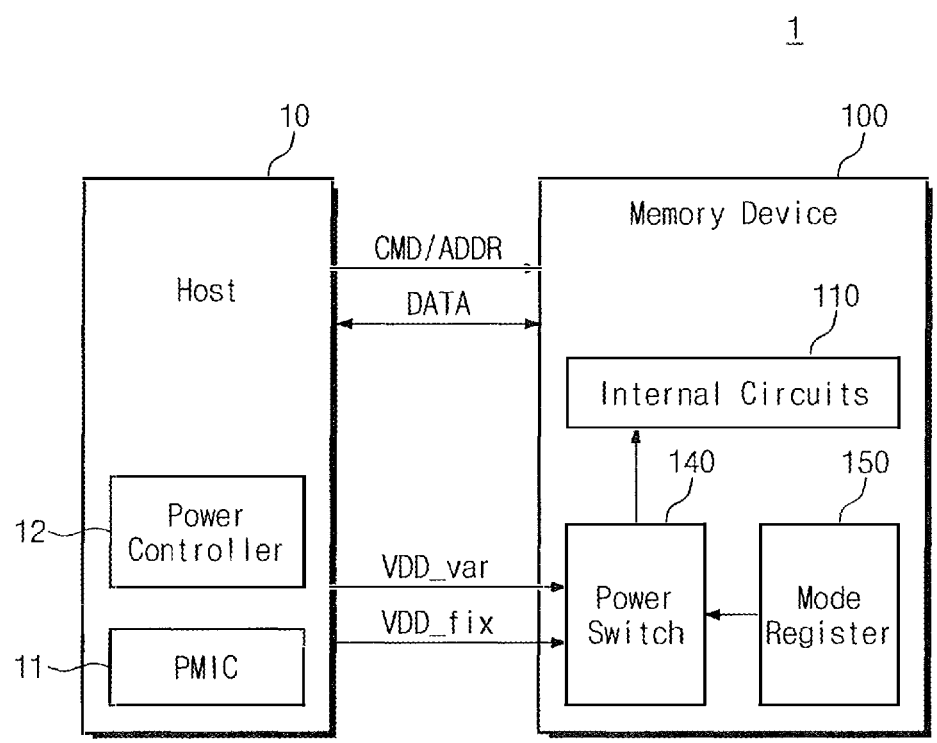
FIG. 1 is a schematic view of an electronic system including a memory device according to an example embodiment of the inventive concept.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

FIG. 1 is a schematic view of an electronic system including a memory device according to an example embodiment of the inventive concept. Referring to FIG. 1, an electronic system 1 may include a host 10 and a memory device 100. The electronic system 1 may be one of a variety of electronic devices such as a home appliance, a computer, a notebook, a tablet, a smart phone, or a wearable device. For example, the electronic system 1 may be a single system including both the host 10 and the memory device 100. In another embodiment, the host 10 and the electronic device 100 may be embodied as separate devices.

The host 10 may include a power management integrated chip (PMIC) 11 and a power controller 12. The PMIC 11 provides a fixed voltage (VDD_fix) and a variable voltage (VDD_var) of a voltage level determined according to a control of the host 10 to the memory device 100. The power controller 12 may monitor a workload of the memory device 100. The power controller 12 may operate a dynamic voltage frequency scaling (DVFS) operation based on the workload. The workload may be an operation bandwidth of the memory device 100. For example, the power controller 12 may monitor the operation bandwidth of the memory device 100 and thus may change a voltage level of the variable voltage (VDD_var) being provided to the memory device 100. In one embodiment, as the operating bandwidth (e.g., the number of operations per unit time) increases, more power is consumed by the memory device 100, and thus more power must be supplied by the PMIC 11 by increasing a voltage supplied to the memory device 100.

When the operation bandwidth of the memory device 100 is low, to reduce power consumption of the memory device 100, the host 10 may provide the variable voltage (VDD_var) changed to a low voltage level to the memory device 100. Conversely, when the operation bandwidth of the memory device 100 is high, to improve operating performance of the memory device 100, the host 10 may provide the variable voltage (VDD_var) changed to a high voltage level to the memory device 100. The host 10 may provide the fixed voltage (VDD_fix) to the memory device 100 to maintain a constant voltage level during an operation of the memory device 100.

In various embodiments, the host 10 is a general-purpose processor, an application processor, or an electronic device. The host 10 may also be a computing device (e.g., a personal computer) including one or more processors, a peripheral device, a digital camera, a personal digital assistant (PDA), a portable media player (PMP), a smart phone, a tablet, or a wearable device, however the inventive concept is not limited thereto.

The memory device 100 may store data provided from the host 10 or store data to be provided to the host 10. The memory device 100 may receive a command and an address from the host 10 to perform a read, write or refresh operation. The memory device 100 may be any storage medium including a volatile memory or a nonvolatile memory.

When the memory device 100 includes a volatile memory, the memory device 100 may include a dynamic random access memory (DRAM), a static RAM (SRAM), a thyristor RAM (TRAM), a zero capacitor RAM (Z-RAM), a twin transistor RAM (TTRAM), or a magnetic RAM (MRAM).

When the memory device 100 includes a nonvolatile memory, the memory device 100 may be an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nanotube floating gate memory (NFGM), a holographic memory, a molecular electronics memory device, or an insulator resistance change memory. One or more bits may be stored in a unit cell of the nonvolatile memory.

In some embodiments, the memory device 100 may include an unbuffered dual in-line memory module (UDIMM), a load reduced DIMM (LRDIMM), or a nonvolatile DIMM (NVDIMM). These examples are not to limit the inventive concept.

The memory device 100 may communicate with the host 10 based on at least one of various wired communication protocols, including for example a USB (universal serial bus), a SCSI (small computer small interface), a PCIe, a M-PCIe (mobile PCIe), an ATA (advanced technology attachment), a parallel-ATA, a serial-ATA, a SAS (serial attached SCSI), an IDE (integrated drive electronics), a Firewire, a UFS (universal flash storage), or a TCP/IP (transmission control protocol/internet protocol). The memory device 100 may communicate with the host 10 based on at least one of various wireless communication protocols including for example a LTE (long term evolution), a WiMax, a GSM (global system for mobile communication), a CDMA (code division multiple access), a HSPA (high speed packet access), a Bluetooth, a NFC (near field communication), a WiFi, or a RFID (radio frequency Identification). Other examples of wired or wireless protocols, including a combination of wired and wireless protocols, are considered within the scope of the inventive concept, and are thus not limited thereby.

The memory device 100 may include an internal circuit 110, a power switch 140, and a mode register 150. The power switch 140 may receive the fixed voltage (VDD_fix) and the variable voltage (VDD_var) from the host 10 and provide one of the fixed voltage (VDD_fix) and the variable voltage (VDD_var) to the internal circuit 110 according to a control command stored in the mode register 150. As described above, a voltage level of the variable voltage (VDD_var) is changed under the control of the host 10 according to a workload, and a voltage level of the fixed voltage (VDD_fix) is not changed during an operation of the memory device 100. The mode register 150 receives and stores a control command to control a switching of the power switch 140 from the host 10.

The electronic system 1 may change a voltage level of the variable voltage (VDD_var) according to a workload of the memory device 100. The host 10 controls the power switch 140 to supply the fixed voltage (VDD_fix) to the memory device 100 while a voltage level of the variable voltage (VDD_var) is changed. A relatively long period of time is required to stabilize the variable supply voltage after it is changed. Conversely, a relatively short period of time is required for the power switch 140 to switch between the fixed voltage (VDD_fix) and the variable voltage (VDD_var), during which time, the memory device 100 stops its operation.

The memory device 100 continuously supplies a stable voltage by supplying the fixed voltage (VDD_fix) until a changed voltage level of the variable voltage (VDD_var) is stabilized. The memory device 100 can minimize a time required to change a voltage and can continuously supply a stable voltage to the internal circuit 110 during the voltage change. A detailed operation of the electronic system 1 including the memory device 100 will be described with reference to FIG. 3. For brevity of description, a single memory device will be described as an example of the memory device 100 of FIG. 1. As described above, the inventive concept may be applied to various storage devices including a plurality of memory devices.

Figure 2:
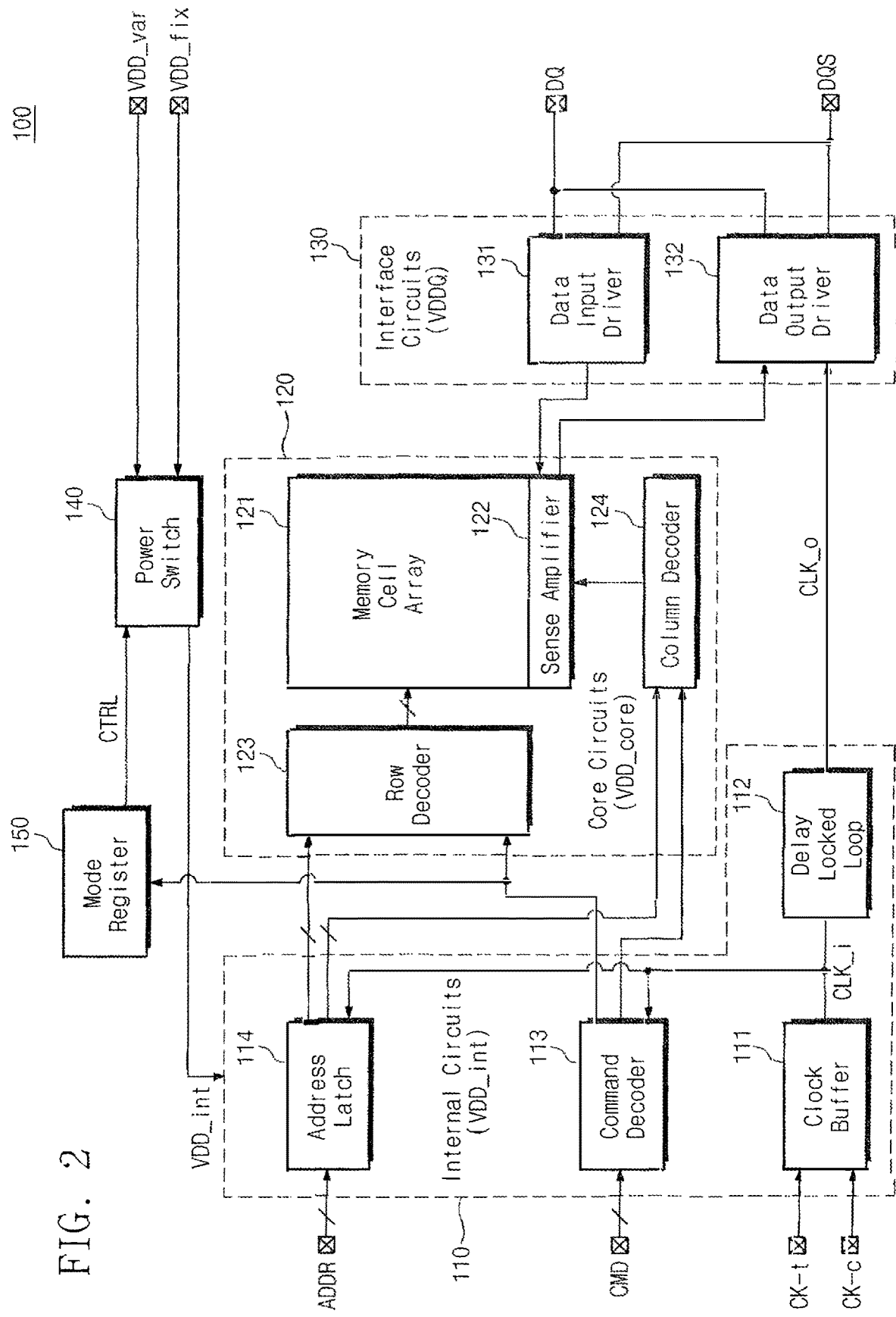
FIG. 2 is a schematic view of the memory device of FIG. 1 according to an example embodiment of the inventive concept.

FIG. 2 is a schematic view of the memory device of FIG. 1 according to an example embodiment of the inventive concept. Referring to FIG. 2, the memory device 100 may include the internal circuit(s) 110, a core circuit 120, an interface circuit 130, the power switch 140, and the mode register 150.

The internal circuit 110 may include a clock buffer 111, a delay locked loop (DLL) 112, a command decoder 113, and an address latch 114. The internal circuit 110 may be driven by an internal voltage (VDD_int). The internal voltage (VDD_int) may be provided by the fixed voltage (VDD_fix) or the variable voltage (VDD_var) through the power switch 140 by a voltage change operation.

The clock buffer 111 may receive a clock signal from a pad (CK_t, CK_c) to generate an input clock signal CLK_i. The DLL 112 may be designed to compensate for a delay from the clock buffer 111 and a data output driver 132 that exist on a transmission path of the input clock input CLK_i inside the memory device 100.

The command decoder 113 receives various commands through a command pad CMD. The command decoder 113 provides a command to a circuit block such as a row decoder 123, a column decoder 124, or the mode register 150.

The address latch 114 receives an address of a memory cell to be accessed through an address pad ADDR. When data is stored in a memory cell or data is read out from the memory cell, an address ADDR that selects the memory cell may be provided through the address latch 114, the column decoder 124 and the row decoder 123.

The core circuit 120 may include a memory cell array 121, a sense amplifier 122, the row decoder 123, and the column decoder 124. The core circuit 120 may be driven by a core voltage (VDD_core). A voltage level of data stored in the memory cell array 121 is sensitive to fabrication process, voltage and temperature ("PVT"). Thus, normal operation of the memory cell array 121, requires a VDD_core value greater than a certain value. Accordingly, the core voltage (VDD_core) is provided with a voltage through the fixed voltage (VDD_fix). Although not illustrated, the core voltage (VDD_core) may be directly provided with the fixed voltage (VDD_fix). In various embodiments, the core voltage (VDD_core) may be provided with a voltage through a voltage regulator, or a voltage generator that uses the fixed voltage (VDD_fix).

The memory cell array 121 may provide stored data to a data output driver 132 through the sense amplifier 122. The memory cell array 121 may store data received from a data input driver 131 through the sense amplifier 122, at a determined address. Accordingly, the column decoder 124 and the row decoder 123 may provide an address of a memory cell with respect to data to be input to, and output from, the memory cell array 121. The memory cell array 121 and the sense amplifier 122 may be driven by various voltages such as a pump voltage VPP, a gate voltage, and a word voltage, in addition to the core voltage (VDD_core). The column decoder 124 and the row decoder 123 may be driven by various voltages to generate a signal having the voltage levels described above.

The interface circuit 130 may include the data input driver 131 and the data output driver 132. To manage a characteristic of the interface circuit 130, the interface circuit 130 may be driven by an interface voltage VDDQ separate from VDD_int for the internal circuit 110 and VDD_core for the core circuit 120.

The data input driver 131 may receive data provided through a data pad DQ to provide the received data to the sense amplifier 122. The data output driver 132 may output data stored in the memory cell array 121 through the data pad DQ. When receiving data, the data input driver 131 may receive a data strobe signal through a data strobe pad DQS. When outputting data, the data output driver 132 may output the data strobe signal through the data strobe pad DQS.

Due to reduced semiconductor fabrication geometries as well as increased power densities (from integrating more memory cells in a given area), the power supply voltage for the memory device 100 has steadily decreased with successive memory generations. Additionally, the memory device 100 has to support a drive voltage having various voltage levels of a high voltage or a low voltage by the DVFS operation for reducing power consumption.

The memory device 100 may include the power switch 140 performing a voltage switching between a plurality of drive voltages and the mode register 150 that stores a control command for controlling the selection of drive voltages.

Figure 5:
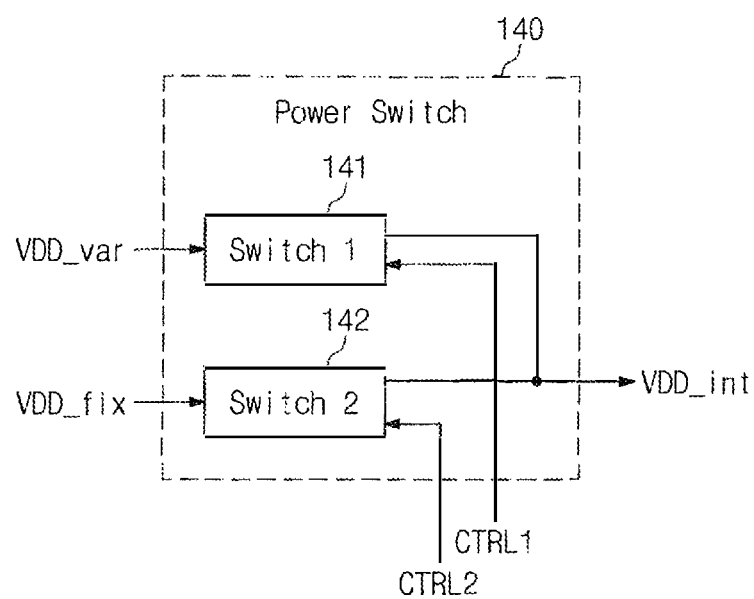
FIG. 5 is a schematic view of an embodiment of the power switch of FIG. 2.
Figure 6:
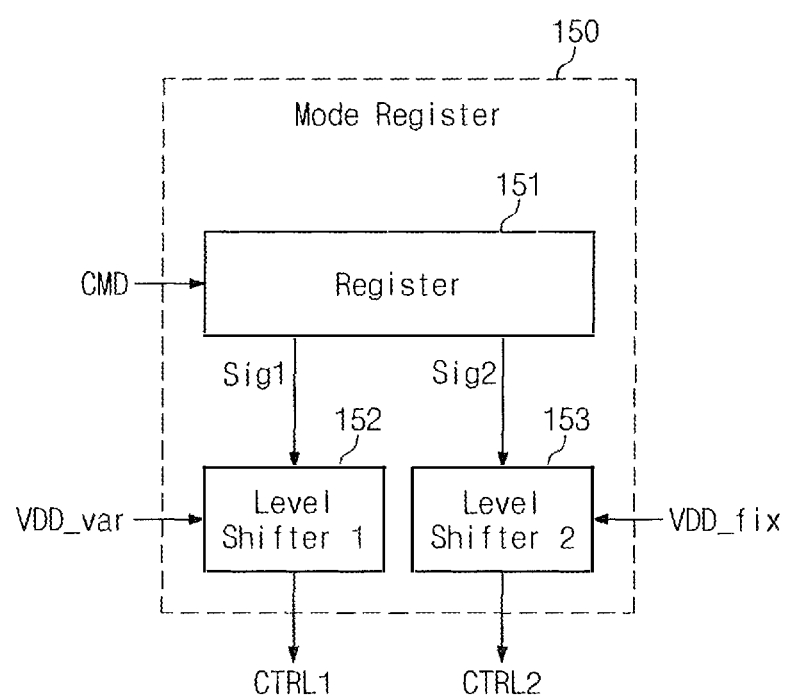
FIG. 6 is a schematic view of an embodiment of the mode register of FIG. 2.

The power switch 140 receives the fixed voltage (VDD_fix) and the variable voltage (VDD_var) and provides a voltage, (selected by a control signal CTRL), to the internal circuit 110 as the internal voltage (VDD_int). An example embodiment of the power switch 140 is illustrated in FIG. 5. The mode register 150 receives and stores a control command CMD from the host 10 of FIG. 1 and provides the stored control command to the power switch 140 as the control signal CTRL. An example constitution of the mode register 150 is illustrated in FIG. 6.

The memory device 100 may include pads for receiving the fixed voltage (VDD_fix) and the variable voltage (VDD_var) respectively. Although not illustrated, in another embodiment the memory device 100 may include a plurality of power lines for providing the fixed voltage (VDD_fix) and the variable voltage (VDD_var) directly to the internal circuit 110 respectively.

Figure 3:
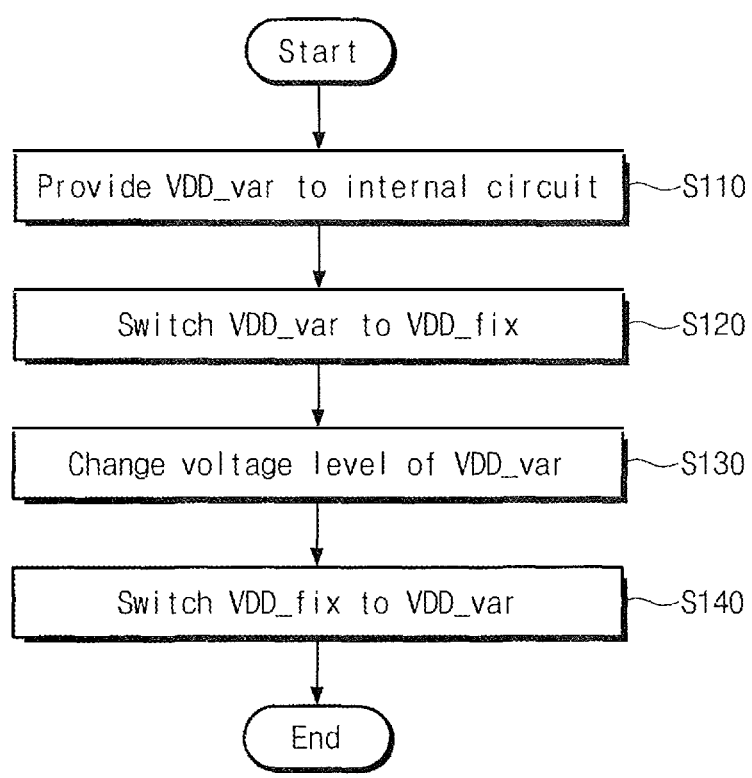
FIG. 3 is a flowchart view of an operation of the electronic system of FIG. 1 according to an example embodiment of the inventive concept.

FIG. 3 is a flowchart view of an operation of the electronic system of FIG. 1 according to an example embodiment of the inventive concept. FIG. 3 will be described with reference to FIG. 1 and FIG. 2. Referring to FIG. 3, the electronic system 1 may provide a stable voltage to the internal circuit 110 included in the memory device 100 even while a voltage level of the variable voltage (VDD_var) is changed.

At operation S110, the memory device 100 provides the variable voltage (VDD_var) to the internal circuit 110 through the power switch 140. As described above, the power switch 140 is controlled by a control command stored in the mode register 150. The mode register 150 stores a control command received from the host 10 to provide the stored control command to the power switch 140. The variable voltage (VDD_var) maintains a stable voltage level during an operation of the internal circuit 110.

The host 10 monitors a workload of the memory device 100 during an operation of the memory device 100. When the workload exceeds a reference value, the host 10 changes the supply voltage of the memory device 100. In another embodiment, the host 10 changes the supply voltage as the workload exceeds a percentage of the reference value. The host 10 may determine a target voltage level being changed according to the workload.

At operation S120, the power switch 140 switches a voltage provided to the internal circuit 110 from the variable voltage (VDD_var) to the fixed voltage (VDD_fix) in response to the control command provided from the host 10. In one example embodiment, a switching of a supply voltage by the power switch 140 may be performed in a power down mode of the memory device 100, because otherwise changing the supply voltage during an operation of the memory device 100 may adversely affect an operating characteristic (e.g. timing) of the memory device 100. In various embodiments, the power down mode is defined by a standard reference of JEDEC (Joint Electron Device Engineering Council). During the power down mode, the memory device 100 is deselected and does not receive a command such as a read, write or refresh command.

In one embodiment, before the memory device 100 enters the power down mode, the host 10 may provide a control command to the memory device 100. The control command may include a command that instructs the power switch 140 to supply the fixed voltage (VDD_fix) to the internal circuit 110 after entering the power down mode. The mode register 150 stores the control command. Subsequently, the stored control command instructs the power switch 140 to switch to the power down mode so that the fixed voltage (VDD_fix) is supplied to the internal circuit 110. After the switching operation is finished, the memory device 100 may exit the power down mode.

At operation S130, the variable voltage (VDD_var) is changed to a target voltage under control of the host 10. While the host 10 performs the operation S130, the memory device 100 may be driven by the fixed voltage (VDD_fix) for at least a portion of the time that the VDD_var voltage is changed. In various embodiments, the memory device 100 is in a power down mode and power is supplied to the internal circuit 110, for a portion of the power down mode, by the fixed voltage (VDD_fix), while the variable voltage (VDD_var) is modified and will not perform normal read, write and refresh operations. In another embodiment, the memory device 100 exits the power down mode and power is supplied to the internal circuit 110 by the fixed voltage (VDD_fix), and may perform normal read, write and refresh operations. During the operation S130, the variable voltage (VDD_var) is changed to a target voltage level and will be allowed to stabilize.

At operation S140, under control of a command provided from the host 10, the power switch 140 switches a voltage provided to the internal circuit 110 from the fixed voltage (VDD_fix) to the variable voltage (VDD_var). A voltage switching operation by the power switch 140 is the same as that described for operation S120. Thus, a description thereof is omitted. Subsequently, the internal circuit 110 operates from the variable voltage (VDD_var) having a changed voltage level.

Consequently, the memory device 100 affects a change to the variable supply voltage level (VDD_var) provided to the internal circuit 110, without compromising an operating characteristic of the memory, by operating under the fixed voltage (VDD_fix) for at least a portion of the time while the VDD_var is changed to a target value.

Figure 4:
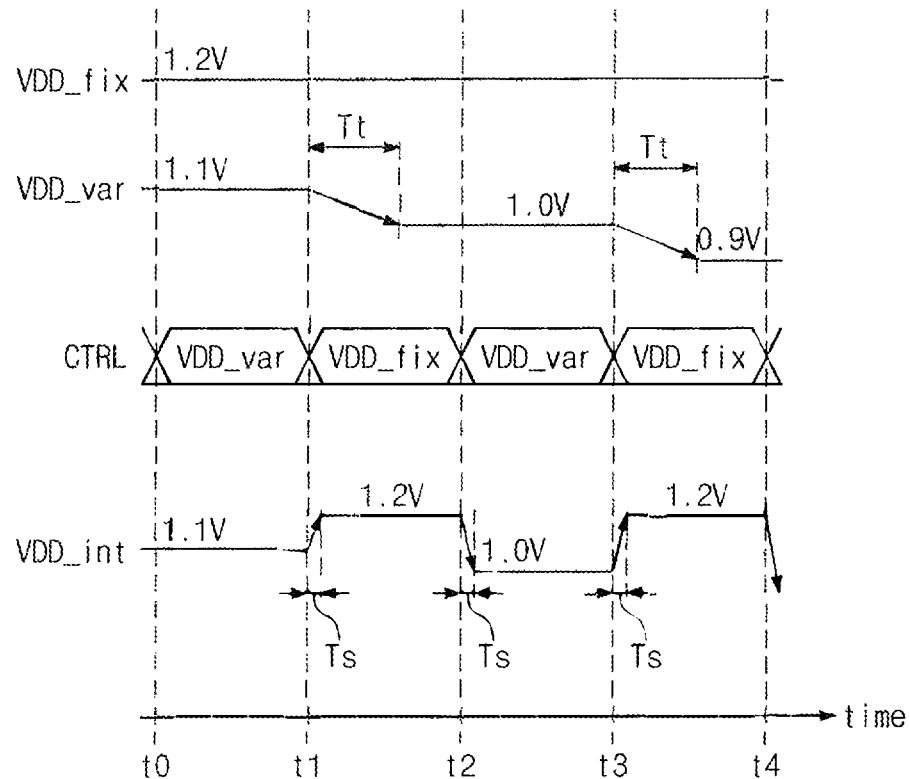
FIG. 4 is a timing diagram illustrating a change of an internal voltage in accordance with an operation of the memory device of FIG. 2.

FIG. 4 is a timing diagram illustrating a change of an internal voltage in accordance with the memory device of FIG. 2 according to example embodiments of the inventive concept. FIG. 4 will be described with reference to FIG. 1 and FIG. 2. In FIG. 4, it is assumed that the memory device 100 reduces the internal voltage (VDD_int) from 1.1V to 0.9V. As described above, at each time point of t0-t4, a switching operation by the control signal CTRL is executed in the power down mode and after the switching operation is completed, the memory device 100 may exit the power down mode to operate normally. Time section Ts is a switching time and time section Tt is a time required for the variable voltage (VDD_var) to change. The voltage change in the variable voltage (VDD_var) can be expressed as VDD+var.

From time t0 to t1, in response to the control signal CTRL provided from the mode register 150, the power switch 140 provides the variable voltage (VDD_var) to the internal voltage (VDD_int). Accordingly, the internal voltage (VDD_int) is provided with 1.1V and the internal circuit 110 operates at 1.1V.

From time t1 to t2, in response to the control signal CTRL, the power switch 140 provides the fixed voltage (VDD_fix) to the internal voltage (VDD_int). Accordingly, the internal voltage (VDD_int) is provided with 1.2V and the internal circuit 110 operates at 1.2V. The variable voltage (VDD_var) is changed to a voltage level of 1.0V and after the time section Tt, VDD_var is stabilized.

From time t2 to t3, in response to the control signal CTRL, the power switch 140 provides the stabilized variable voltage (VDD_var) to the internal voltage (VDD_int). Accordingly, the internal voltage (VDD_int) is provided with 1.0V and the internal circuit 110 operates at 1.0V.

From time t3 to t4, in response to the control signal CTRL, the power switch 140 provides the fixed voltage (VDD_fix) to the internal voltage (VDD_int). The internal voltage (VDD_int) is provided with 1.2V and the internal circuit 110 operates at 1.2V, similar to the time section t1 to t2. The variable voltage (VDD_var) is changed to a voltage level of 0.9V and after the time section Tt, VDD_var is stabilized.

After the time t4, the memory device 100 performs the same operation as that in the time section t2 to t3. Specifically, the internal circuit 110 is provided with a voltage level of 0.9V from the variable voltage (VDD_var) to operate. Consequently, the memory device 100 undergoes a voltage change from 1.1V to 0.9V to the internal circuit 110, without adversely affecting the memory operating characteristics (e.g. timing).

FIG. 5 is a schematic view of an embodiment of the power switch of FIG. 2. Referring to FIG. 5, the power switch 140 may include a first switch 141 and a second switch 142. The control signal CTRL may include a first control signal CTRL1 and a second control signal CTRL2.

The first switch 141 is controlled by the first control signal CTRL1 and provides the variable voltage (VDD_var) to the internal voltage (VDD_int). The second switch 142 is controlled by the second control signal CTRL2 and provides the fixed voltage (VDD_fix) to the internal voltage (VDD_int).

The first and second control signals (CTRL1, CTRL2) are generated with non-overlapping phases so that the first and second switches 141 and 142 are not turned on at the same time. Since voltage levels transmitted by the first and second switches 141 and 142 are different from each other, the first and second control signals (CTRL1, CTRL2) may be provided to the first and second switches 141 and 142 as different respective voltage levels.

For example, the first and second switches 141 and 142 may be implemented by a switch circuit such as an NMOS transistor, a PMOS transistor, or a transmission gate. The power switch 140 may be implemented by a multiplexer. The power switch 140 may further include a voltage regulator for providing a more stable voltage to the internal circuit 110. However, the power switch 140 of the inventive concept is not limited thereto.

FIG. 6 is a schematic view of an embodiment of the mode register illustrated in FIG. 2. FIG. 6 will be described with reference to FIG. 2 and FIG. 5. Referring to FIG. 6, the mode register 150 may include a register 151, a first level shifter 152, and a second level shifter 153. The control signal CTRL may include the first and second control signals (CTRL1, CTRL2).

The register 151 may be provided with a control command for a voltage change from the command decoder 113. Although not illustrated, by a mode register write command, the register 151 may receive data from the data input driver 131 of FIG. 2 to store a control command for a voltage change. The register 151 generates first and second signals (Sig1, Sig2) for controlling a switching of the power switch 140 based on the stored control command. For example, when the power switch 140 includes the first and second switches 141 and 142 as depicted in FIG. 5, the generated first and second signals (Sig1, Sig2) may be signals having an opposite logic level, with non-overlapping phases.

The first level shifter 152 receives the first signal Sig1 and changes the received first signal Sig1 to a voltage level of the variable voltage (VDD_var) to provide CTRL1 at the voltage level of the variable voltage (VDD_var) to the first switch 141 of FIG. 5. The second level shifter 153 receives the second signal Sig2 and changes the received second signal Sig1 to a voltage level of the fixed voltage (VDD_fix) to provide CTRL2 at the voltage level of the fixed voltage (VDD_fix) to the second switch 142 of FIG. 5. The voltage levels of the first and second signals (Sig1, Sig2) are changed to match the corresponding variable voltage (VDD_ var) and the fixed voltage (VDD_fix) transmitted by the first and second switches 141 and 142. Specifically, in the example embodiment of FIG. 5, each of the first and second switches 141 and 142 normally transmit the variable voltage (VDD_var) and the fixed voltage (VDD_fix) respectively.

In the example embodiment of FIG. 6, the mode register 150 comprises a level shifter. In another example embodiment, the mode register 150 comprises a voltage regulator or a voltage generator. When the register 151 is configured to generate a logic signal (CTRL1, CTRL2) having a sufficiently high or low voltage level as compared to the variable voltage (VDD_var) and the fixed voltage (VDD_fix), the mode register 150 may not include the level shifter, the voltage regulator, or the voltage generator described above. The aforementioned examples are illustrative and the mode register 150 is not limited thereto. Although not illustrated, the first and second control signals (CTRL1, CTRL2) may be controlled to enter the power down mode and then turn off the respective first and second switches 141 and 142 of FIG. 5 during a certain period of time. It may be easily understood by those of ordinary skill in the art that a logic circuit for this may be further added.

Figure 7:
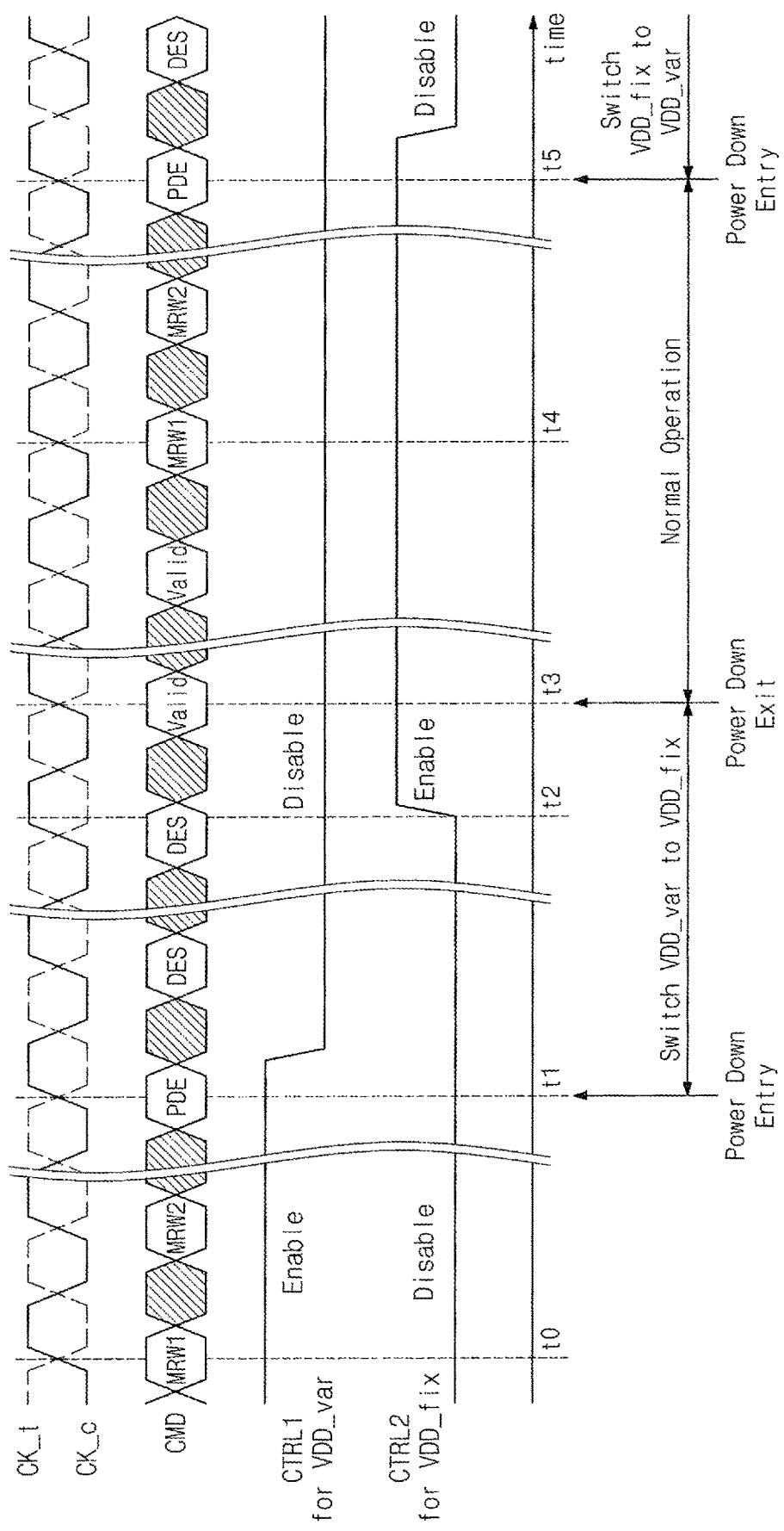
FIG. 7 is a timing diagram of a process in which the memory device of FIG. 2 receives a control signal to switch a supply voltage.

FIG. 7 is a timing diagram of a process in which the memory device of FIG. 2 receives a control signal to switch a supply voltage. FIG. 7 will be described with reference to FIG. 1 and FIG. 2.

At time t0 to t1, the memory device 100 receives first and second mode register write commands (MRW1, MRW2) from the host 10. In response to the first and second mode register write commands (MRW1, MRW2), a control command for controlling a switching of the power switch 140 of the memory device 100 is stored in the mode register 150. In a corresponding section, the power switch 140 operates in response to the first and second control signals (CTRL1, CTRL2) generated based on the previously stored control command of the mode register 150. Specifically, the power switch 140 provides the variable voltage (VDD_var) to the internal circuit 110.

At time t1, the memory device 100 receives a power down entry command from the host 10 to enter the power down mode. As described in FIG. 6, after entering the power down mode, the first and second control signals (CTRL1, CTRL2) maintain a logic level that turns off the first and second switches 141 and 142 of FIG. 5 for a certain period of time. Subsequently, the internal circuit 110 is not provided with a supply voltage and enters a floating state. The host 10 may change a voltage level of the variable voltage (VDD_var) beginning at time t1.

At time t2, in response to the control command, which is received at time t0 and then stored in the mode register 150, the power switch 140 of the memory device 100 switches so that the fixed voltage (VDD_fix) is provided to the internal circuit 110. From time t1 to t2, since the memory device 100 entered the power down mode, the memory device 100 does not operate in synchronization with a clock signal.

At time t3, the memory device 100 receives a valid command such as read, write, or refresh. from the host 10 to operate normally. Subsequently, a change of a voltage level of the variable voltage (VDD_var) by the host 10 is completed. From time t3 to t5, the memory device 100 operates from the fixed voltage (VDD_fix).

From time t4 to t5, the memory device 100 receives a control command for switching a supply voltage from the host 10 and then enters the power down mode for performing a voltage switching operation. After time t5, in response to the control command, which is received at time t4 and is stored in the mode register 150, the power switch 140 of the memory device 100 switches so that the variable voltage (VDD_var) is provided to the internal circuit 110. Since a subsequent operation is the same as the operation during the time t1 to t3, a description thereof is omitted.

Figure 8:
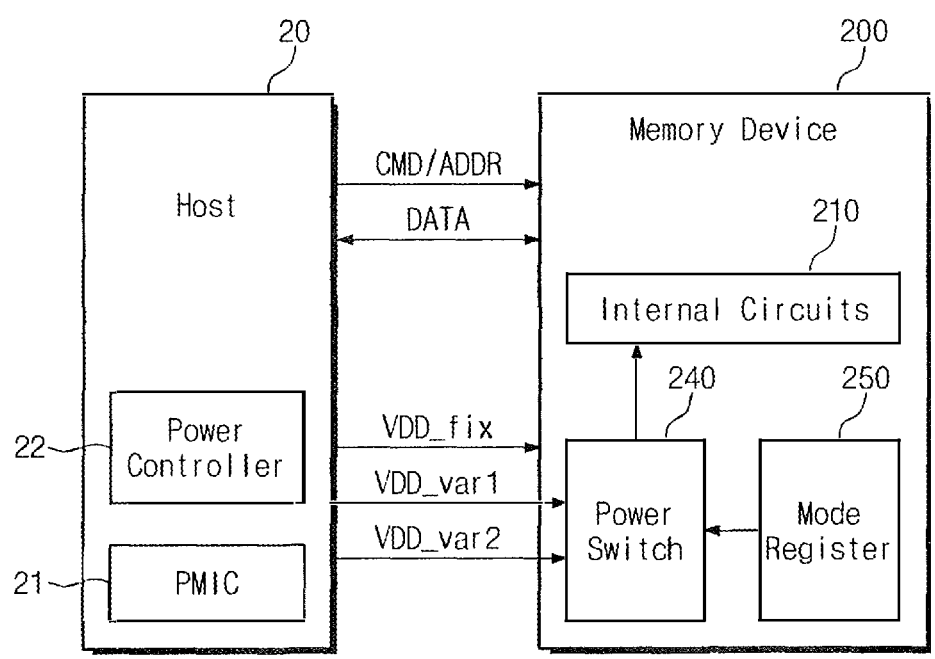
FIG. 8 is a schematic view of an electronic system including a memory device according to an example embodiment of the inventive concept.

FIG. 8 is a schematic view of an electronic system including a memory device according to an example embodiment of the inventive concept. Referring to FIG. 8, an electronic system 2 may include a host 20 and a memory device 200. The host 20 may include a power management integrated chip (PMIC) 21 similar to the PMIC 11 of FIG. 1.

The memory device 200 may include an internal circuit 210, a power switch 240, and a mode register 250. The internal circuit 210 is supplied with power by selecting between first and second variable voltages (VDD_var1, VDD_var2) through the power switch 240. Otherwise, the memory device 200 has a similar operation and composition as the memory device 100 of FIG. 1, thus, a description of similar elements is omitted for brevity. Although not illustrated, the memory device 200 may include pads for receiving the fixed voltage (VDD_fix) and the first and second variable voltages (VDD_var1, VDD_var2) respectively.

The electronic system 2 may change a voltage level of the second variable voltage (VDD_var2) while the internal circuit 210 is driven by the first variable voltage (VDD_var1). As described above, the second variable voltage (VDD_var2) may being changed to a voltage level determined according to a workload of the memory device 200. After a voltage change of the second variable voltage (VDD_var2) is completed, the electronic system 2 controls the memory device 200 to provide the second variable voltage (VDD_var2) to the internal circuit 210. In contrast to the electronic system 1 of FIG. 1, while a voltage level of the second variable voltage (VDD_var2) is changed, the electronic system 2 may omit a process of switching over to the fixed voltage (VDD_fix). Accordingly, the electronic system 2 may eliminate a wasteful step of switching to the VDD_fix voltage while a variable voltage is being changed to a target voltage provided to the internal circuit 210 of the memory device 200.

Figure 9:
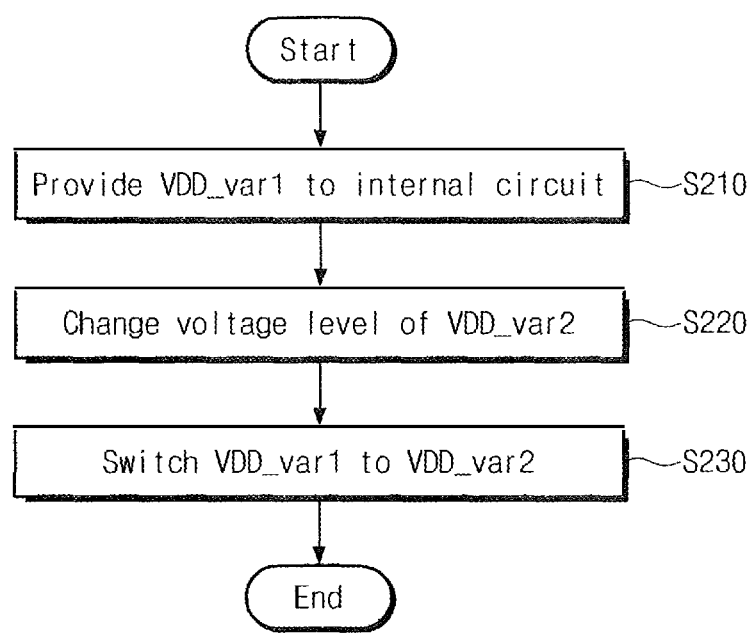
FIG. 9 is a flowchart view of an operation of the electronic system of FIG. 8 according to an example embodiment of the inventive concept.

FIG. 9 is a flowchart view of an operation of the electronic system of FIG. 8 according to an example embodiment of the inventive concept. FIG. 9 will be described with reference to FIG. 8. Referring to FIG. 9, the electronic system 2 may provide the second variable voltage (VDD_var2), with a changed voltage, to the internal circuit 210 by one switching operation.

At operation S210, the memory device 200 provides the first variable voltage (VDD_var1) to the internal circuit 210 through the power switch 240. This operation is similar to the operation S110 of FIG. 3, thus a description thereof is omitted.

At operation S220, the second variable voltage (VDD_var2) is changed to a target voltage under the control of the host 10. During an operation of the internal circuit 210, the first variable voltage (VDD_var1) maintains a stable voltage level. The host 20 monitors a workload of the memory device 200 and thus performs a change operation of a supply voltage of the memory device 200. While the host 20 performs the operation S220, the memory device 200 is driven by the first variable voltage (VDD_var1) and may perform normal read, write and refresh operations. Through the operation S220, the second variable voltage (VDD_var2) is changed to the target voltage level and allowed to stabilize.

At operation S230, by a control command provided from the host 20, the power switch 240 switches a voltage provided to the internal circuit 210 from the first variable voltage (VDD_var1) to the second variable voltage (VDD_var2). A voltage switching operation by the power switch 240 is described in the operation S120 of FIG. 3, thus a description thereof is omitted. As described above, a switching of a supply voltage by the power switch 240 is performed during the power down mode of the memory device 200, similar to the illustration in FIG. 7.

Figure 10:
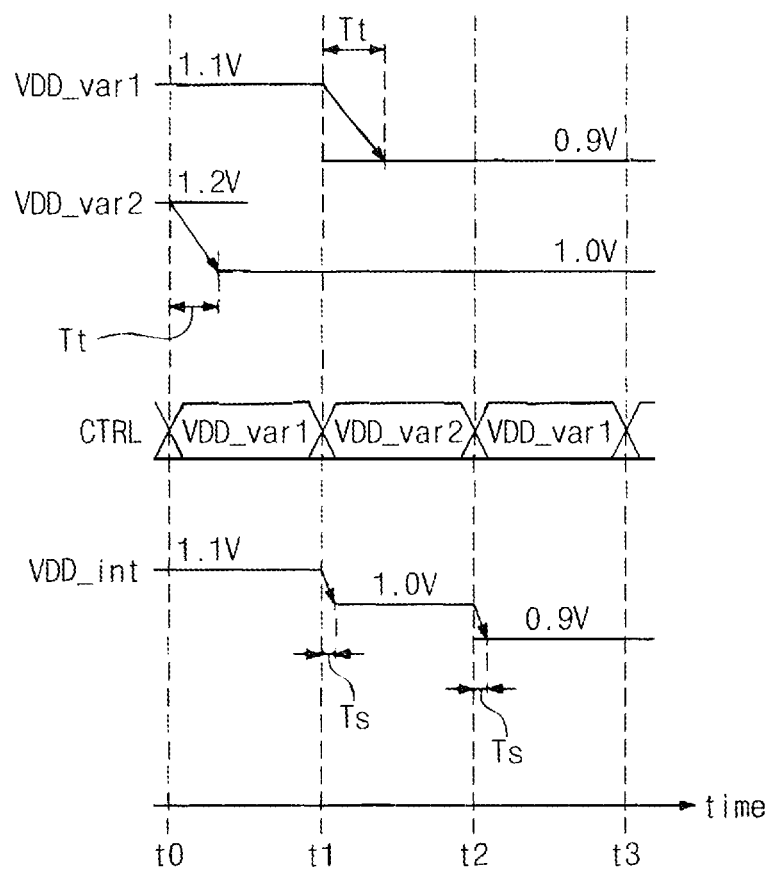
FIG. 10 is a timing diagram of a change of an internal voltage in accordance with an operation of the memory device of FIG. 8.

FIG. 10 is a timing diagram of a change of an internal voltage in accordance with an operation of the memory device of FIG. 8. FIG. 10 will be described with reference to FIG. 4 and FIG. 8. In FIG. 8, similar to FIG. 4, it is assumed that the memory device 200 reduces the internal voltage (VDD_int) from 1.1V to 0.9V. Here, a definition of a time section Ts and a time section Tt is the same as described in FIG. 4.

From time t0 to t1, in response to the control signal CTRL provided from the mode register 250, the power switch 240 provides the first variable voltage (VDD_var1) to the internal voltage (VDD_int). The internal voltage (VDD_int) is provided with 1.1V and the internal circuit 210 operates at 1.1V. A voltage level of the second variable voltage (VDD_var2) is changed from 1.2V to 1.0V and stabilizes after the time section Tt.

From time t1 to t2, in response to the control signal CTRL, the power switch 240 provides the second variable voltage (VDD_var2) to the internal voltage (VDD_int). Accordingly, the internal voltage (VDD_int) is provided with 1.0V and the internal circuit 210 operates at 1.0V. The first variable voltage (VDD_var1) is changed from a voltage level of 1.1V to a voltage level of 0.9V and stabilizes after the time section Tt.

From time t2 to t3, in response to the control signal CTRL, the power switch 240 provides the stabilized first variable voltage (VDD_var1) to the internal voltage (VDD_int). Accordingly, the internal circuit 210 is provided with the first variable voltage (VDD_var1) to operate at 0.9V.

After the time t3, the memory device 200 performs the same operation as during the time section t1 to t3. Consequently, the memory device 200 provides a voltage changing from 1.1V to 0.9V to the internal circuit 210. As compared with FIG. 4, the memory device 200 may omit a process of switching to the fixed voltage (VDD_fix) during a portion of the time required to stabilize a changed variable voltage.

Figure 11:
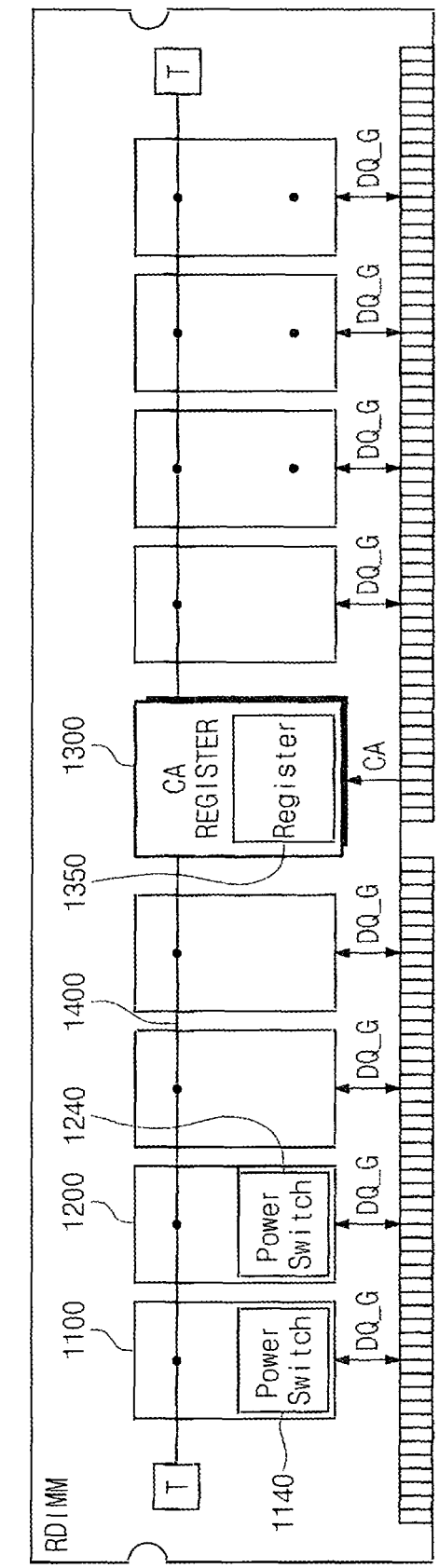
FIG. 11 and FIG. 12 are schematic views of a memory module according to an example embodiment of the inventive concept.
Figure 12:
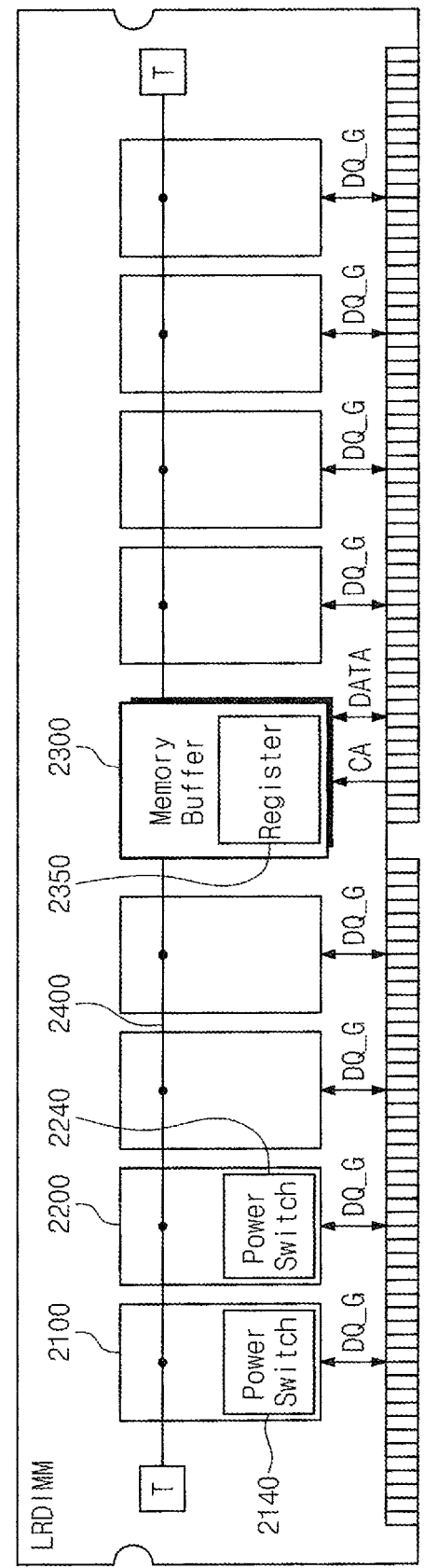

FIG. 11 and FIG. 12 are schematic views of a memory module according to an example embodiment of the inventive concept. Memory modules 1000 and 2000 illustrated in FIG. 11 and FIG. 12 have a structure of a dual in-line memory module (DIMM). The memory modules 1000 and 2000 may respectively include the memory devices 100 and 200 comprising the power switches 140 and 240 respectively described with respect to FIG. 1 through FIG. 10. In FIG. 11, the memory device 100 is illustrated as first and second memory devices 1100, and 1200 respectively. In FIG. 12, the memory device 200 is illustrated as first and second memory devices 2100 and 2200 respectively.

Referring to FIG. 11, an A type memory module 1000 having a form of a registered DIMM is illustrated. The A type memory module 1000 may include the first and second memory devices 1100 and 1200, a command/address (CA) register 1300, and a transmission path 1400. The first and second memory devices 1100 and 1200 are connected to the command/address (CA) register 1300. The command/address (CA) register 1300 operates as a buffer of an address or a command transmitted from the host to the first and second memory devices 1100 and 1200 to reduce a load of an output unit of the host.

When the host accesses the first and second memory devices 1100 and 1200 in a RDIMM structure, the host directly exchanges data with each of the first and second memory devices 1100 and 1200 through an individual transmission path (DQ_G). Alternatively, the host provides an address or a command to the first and second memory devices 1100 and 1200 respectively through the CA register 1300.

Each of the first and second memory devices 1100 and 1200 may include power switches 1140 and 1240 respectively. The power switches 1140 and 1240 are controlled by a control command received from the CA register 1300 through the transmission path 1400. The CA register 1300 may include a register 1350. The register 1350 may be the mode registers 150 and 250 illustrated in FIG. 1 and FIG. 8 respectively. The register 1350 stores a control command with respect to the power switches 1140 and 1240 provided from the host and provides the stored control command to the power switches 1140 and 1240. An operation thereof is described in FIG. 1 through FIG. 10, thus a description thereof is omitted. Since the host may process a control of power supply voltages with respect to the first and second memory devices 1100 and 1200 by one control command, a management of a voltage change operation of the first and second memory devices 1100 and 1200 is facilitated.

Referring to FIG. 12, a B type memory module 2000 having a form of a load reduced DIMM (LRDIMM) is illustrated. The B type memory module 2000 may include first and second memory devices 2100 and 2200, a memory buffer 2300, and a transmission path 2400. The first and second memory devices 2100 and 2200 are connected to the memory buffer 2300 through the transmission path 2400. The memory buffer 2300 performs a function of reducing a load of an output unit of the host.

When the host accesses the first and second memory devices 2100 and 2200 in the LRDIMM structure, the host indirectly exchanges data, a command, and an address with the first and second memory devices 2100 and 2200 through the memory buffer 2300 and the transmission path 2400.

Each of the first and second memory devices 2100 and 2200 may include power switches 2140 and 2240 respectively. The power switches 2140 and 2240 are controlled by a control command received from the memory buffer 2300 through the transmission path 2400. The memory buffer 2300 may include a register 2350. The register 2350 may be the mode registers 150 and 250 illustrated in FIG. 1 and FIG. 8 respectively. An operation of the register 2350 is the same as the operation of the mode register 1350 described in FIG. 11, thus a description thereof is omitted. In the B type memory module 2000, a management of a voltage change operation of the first and second memory devices 2100 and 2200 by the host is facilitated in a manner similar to the A type memory module 1000 of FIG. 11.

An electronic device that changes a supply voltage according to example embodiments of the inventive concept may include a power switch for switching over to a stabilized supply voltage and a mode register storing a control command. An electronic device and a method of changing a supply voltage according to example embodiments of the inventive concept may always supply a stable voltage even while a voltage level of the supply voltage is changed. Accordingly, a management of an operating characteristic of the electronic device is facilitated.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A memory device comprising:
an internal circuit; and
a power switch configured to receive a first voltage and a second voltage, and to provide one of the first voltage and the second voltage to the internal circuit in response to a control command,
wherein the power switch provides the second voltage to the internal circuit while a level of the first voltage is changed and provides the first voltage to the internal circuit after a level change of the first voltage is completed.

2. The memory device of claim 1, further comprising:
a mode register configured to store the control command and to provide the stored control command to the power switch.

3. The memory device of claim 1, further comprising:
a first pad configured to receive the first voltage from a power management device and to provide the received first voltage to the power switch; and
a second pad configured to receive the second voltage from the power management device and to provide the received second voltage to the power switch.

4. The memory device of claim 3, wherein the power management device comprises:
a power control unit configured to generate the control command and to determine one of a level of the first voltage and a level of the second voltage according to a workload of the memory device; and
a voltage generating unit configured to generate the first voltage and the second voltage having respective levels determined by the power control unit.

5. The memory device of claim 4, wherein the power management device changes the level of the first voltage according to the workload of the memory device and does not change the level of the second voltage during an operation of the memory device.

6. The memory device of claim 4, wherein the power management device changes the level of the first voltage and the level of the second voltage, each level changed according to the workload of the memory device and maintains the level of the second voltage while the level of the first voltage is changed.

7. The memory device of claim 1, wherein the internal circuit includes at least one of a clock buffer, a delay locked loop (DLL), a command decoder, and an address latch.

8. A memory device comprising:
an internal circuit configured to be driven by an internal voltage; and
a power switch configured to receive a first voltage and a second voltage, and to provide as the internal voltage one of the first voltage and the second voltage to the internal circuit in response to a control command,
wherein the power switch switches a voltage provided to the internal circuit from the first voltage to the second voltage in response to the control command when the first voltage is provided to the internal circuit after a level change of the second voltage is completed.

9. The memory device of claim 8, wherein a level of the second voltage is determined according to a workload of the memory device.

10. The memory device of claim 8, wherein a level of the first voltage is fixed during an operation of the memory device.

11. The memory device of claim 10, wherein the power switch further switches a voltage provided to the internal circuit from the second voltage to the first voltage in response to the control command when the second voltage is provided to the internal circuit,
wherein switching the voltage to the first voltage is performed before providing the first voltage to the internal circuit.

12. The memory device of claim 11, further comprising:
a mode register configured to store the control command received from a power management device included in an electronic device and to provide the stored control command to the power switch,
wherein storing the control command is performed before switching the voltage to one of the first voltage and the second voltage.

13. The memory device of claim 11, wherein each of switching the voltage to one of the first voltage and the second voltage is performed in a power down mode of the memory device.

14. The memory device of claim 12, wherein the power management device changes a level of the first voltage and a level of the second voltage, each level changed according to a workload of the memory device and the first and second voltages having the changed level provided to the memory device, and
wherein the level of the first voltage is maintained while the level of the second voltage is changed.

15. The memory device of claim 8, wherein the internal circuit includes one or more of a clock buffer, a delay locked loop (DLL), a command decoder, and an address latch.

16. The memory device of claim 8, wherein the power switch further comprises a voltage regulator.

17. A method of changing an internal voltage of a memory device comprising:

receiving a first voltage and a second voltage from a power management device included in a host which monitors a workload of the memory device during an operation of the memory;

providing the first voltage as the internal voltage to an internal circuit in the memory device in response to a control command; and switching a voltage provided to the internal circuit from the first voltage to the second voltage in response to the control command when the first voltage is provided to the internal circuit after a level change of the second voltage is completed.

18. The method of claim 17, wherein the workload includes an operation bandwidth of the memory device.

19. The method of claim 17, wherein one of a level of the first voltage and a level of the second voltage is fixed during an operation of the memory device.

20. The method of claim 19, further comprising switching a voltage provided to the internal circuit from the second voltage to the first voltage in response to the control command when the second voltage is provided to the internal circuit.

* * * * *